United States Patent [19]
Sugisaka et al.

[11] Patent Number: 5,557,134
[45] Date of Patent: Sep. 17, 1996

[54] DIELECTRIC ISOLATED TYPE SEMICONDUCTOR DEVICE

[75] Inventors: Takayuki Sugisaka, Okazaki; Toshio Sakakibara, Nishio; Shoji Miura, Nukata-gun; Makio Iida, Ichinomiya, all of Japan

[73] Assignee: Nippondenso Co., Ltd., Kariya, Japan

[21] Appl. No.: 341,977

[22] Filed: Nov. 16, 1994

[30] Foreign Application Priority Data

Nov. 17, 1993 [JP] Japan .................................. 5-288309

[51] Int. Cl.⁶ ................................................ H01L 29/00
[52] U.S. Cl. .......................................... 257/506; 257/510
[58] Field of Search .................................. 257/506, 513, 257/510, 511

[56] References Cited

U.S. PATENT DOCUMENTS

| | | | |
|---|---|---|---|
| 4,814,852 | 3/1989 | Sundstrom | 257/510 |
| 5,322,683 | 7/1994 | Miyashita et al. | 257/506 |
| 5,332,920 | 7/1994 | Nakagawa et al. | 257/506 |
| 5,449,946 | 9/1995 | Sakakibara et al. | |

OTHER PUBLICATIONS

*IBM Tech Bul,* vol. 28 #6, Nov. 1985, pp. 2335–2336.
Okonogi et al, Extended Abstracts (The 41st Spring Meeting, 1994); The Japan Society Of Applied Physics And Related Societies, Mar. 28, 1994, 29p-ZL-14.

"A Bonded Wafer Bipolar Process In Manufacturing" C. J. McLachlan et al, pp. 43–54 Harris Semiconductor ©1993.

"Analog CMOS Circuits On Thick Film SOI" Kevin Yallup Analog Devices BV, Raheen Industrial Estate, Limerick, Ireland, pp. 117–128 ©1993.

"Application Of 150 mm Bonded Wafer Technology To A Power Asic Process" G. V. Rouse et al Harris Semiconductor, pp. 283–292 ©1993.

*Primary Examiner*—Stephen Meier
*Attorney, Agent, or Firm*—Cushman, Darby & Cushman

[57] ABSTRACT

A dielectric isolated type semiconductor device which can achieve a reduction in crystalline defects by means of a simple production process is provided. High-concentration regions are formed as active regions on a surface portion of an islandish semiconductor region which is isolated from an adjacent semiconductor region by means of an isolation trench. According to a first aspect of the present invention, an N type crystalline defect suppression region doped at a high concentration and deeper than the high-concentration regions is formed over the entire surface of an adjacent semiconductor region. According to a second aspect of the present invention, a high-concentration N type crystalline defect suppression region is provided on a surface portion of a P type high-concentration region is formed with identical structure and by an identical production process. By means of these N type regions, crystalline defects are reduced.

16 Claims, 6 Drawing Sheets

DIELECTRIC ISOLATED TYPE SEMICONDUCTOR DEVICE

CROSS REFERENCE TO RELATED APPLICATION

This application claims the benefit of priority of the prior Japanese patent application No. 5-288309 filed on Nov. 17, 1993, the contents of which are incorporated herein by reference.

BACKGROUND OF THE INVENTION

1. Field of the Invention

The present invention relates to a dielectric isolated type semiconductor device.

2. Description of the Related Arts

Conventionally, dielectric isolated type semiconductor device having an island semiconductor region, the bottom of which is isolated from a semiconductor substrate and the side of which is isolated from an adjacent semiconductor region by means of an isolation trench, with active elements such as transistors and diodes formed in this islandish semiconductor region, has been widely produced.

In such a dielectric isolated type semiconductor device, it is important to reduce crystalline defects in order to improve the characteristics of the active elements formed in the island semiconductor region, but conventionally the addition of complex production processes was required for this purpose. In particular, compression stress on the surface of an island semiconductor region in a dielectric isolated type semiconductor device is large in comparison with a semiconductor device of PN junction isolated type, and so crystalline defects easily occur.

SUMMARY OF THE INVENTION

In light of the foregoing problem, it is an object of the present invention to provide a dielectric isolated type semiconductor device which can achieve a reduction in crystalline defects by means of a simple production process.

A semiconductor device according to a first aspect of the present invention, being a dielectric isolated type semiconductor device comprising an island semiconductor region the bottom of which is isolated from a semiconductor substrate and the side of which is isolated from an adjacent semiconductor region by means of an isolation trench, and a high-concentration region formed on a surface portion of the foregoing island semiconductor region, characterized by further comprising an N type crystalline defect suppression region doped at high concentration on the entire surface of the foregoing adjacent semiconductor region and formed more deeply than the foregoing high-concentration region.

A semiconductor device according to a second aspect of the present invention, being a dielectric isolated type semiconductor device comprising an island semiconductor region the bottom of which is isolated from a semiconductor substrate and the side of which is isolated from an adjacent semiconductor region by means of an isolation trench, and a P type high-concentration region formed as an anode of a diode or an emitter or collector of a PNP bipolar transistor on a surface portion of the foregoing island semiconductor region, characterized by further comprising a high-concentration N type crystalline defect suppression region formed on a surface portion of the foregoing P type high-concentration region.

In a favorable state, the foregoing N type crystalline defect suppression region is formed with doping $1 \times 10^{19}$ atoms/cm$^3$ or more of phosphorus.

In this arrangement, a high-concentration region is formed as an active region on a surface portion of an island semiconductor region the side of which is isolated from an adjacent semiconductor region by means of an isolation trench.

Further, according to a first aspect of the present invention, an N type crystalline defect suppression region doped at a high concentration and deeper than the foregoing high-concentration region is formed over the entire surface of an adjacent semiconductor region.

It was ascertained by experimentation that a semiconductor device in which the above-mentioned N type crystalline defect suppression region is formed according to the present invention can markedly reduce crystalline defects in comparison with a semiconductor device of identical structure and formed by an identical production process but not formed with the foregoing N type crystalline defect suppression region.

Moreover, it was ascertained that according to a second aspect of the present invention, a semiconductor device according to the present invention providing a high-concentration N type crystalline defect suppression region on a surface portion of a P type high-concentration region can markedly reduce crystalline defects in comparison with a semiconductor device of identical structure and formed by an identical production process but not formed with the foregoing N type crystalline defect suppression region.

The above-mentioned mode of operation is hypothesized to be due to a gettering effect of heavy-metal ions causing crystalline defects by means of phosphorus ions which become the dopant of the N type region.

That is to say, it is known that the doping diffusion coefficient in an insulation material of oxide film or the like normally has a difference in order of several decimal places in comparison with that within a semiconductor region, and diffusion speed is extremely slow; consequently, it was thought that heavy metal contamination of an island semiconductor region isolated by means of insulation material did not become a problem, but according to the present experimentation it is conjectured that even if an isolation region existed, heavy metal contamination via the isolation region would exist to a certain extent, and heavy metal contamination could be prevented by means of an N type crystalline defect suppression region.

BRIEF DESCRIPTION OF THE DRAWINGS

Other objects, features and characteristics of the present invention will be appreciated from a study of the following detailed description, the appended claims, and drawings, all of which form a part of this application. In the drawings:

DETAILED DESCRIPTION OF THE EMBODIMENTS (First Embodiment)

Figure 1:
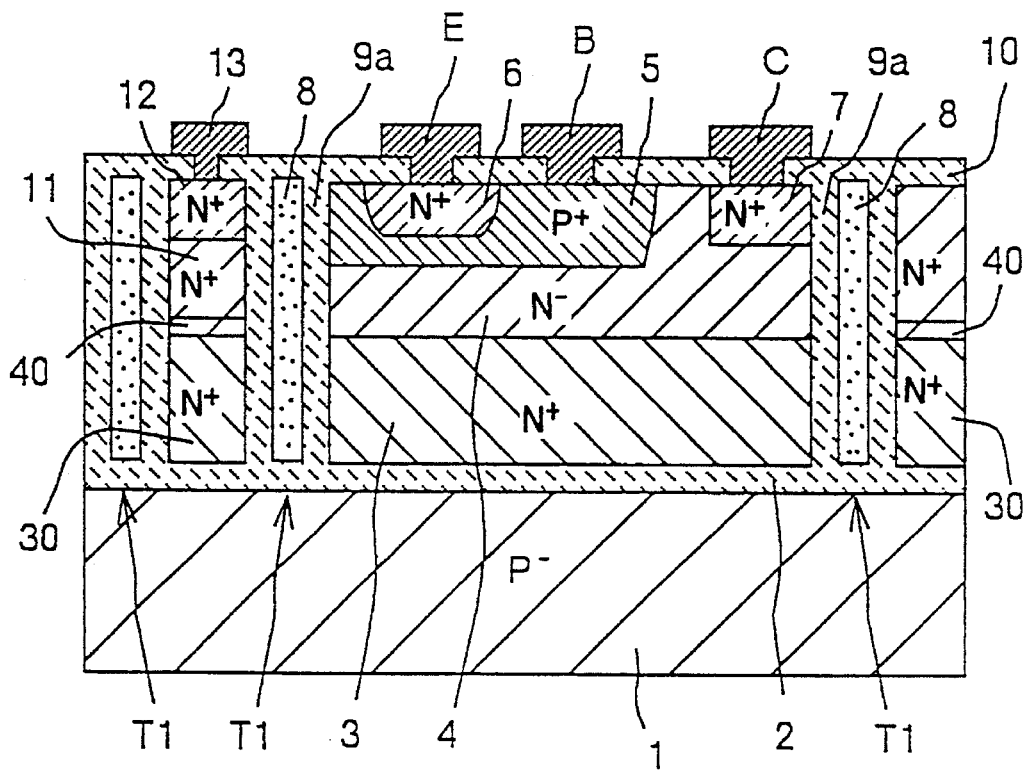
FIG. 1 is a sectional view of a semiconductor device according to a first embodiment of the present invention.

FIG. 1 shows a high withstand voltage NPN bipolar transistor as a first embodiment according to a first aspect of the present invention.

In FIG. 1, 1 is a P$^-$ silicon substrate (semiconductor substrate), 2 is a buried silicon oxide film as bottom insulation for an island semiconductor region, 3 is an N$^+$ buried collector region, 4 is an N$^-$ collector withstand voltage region, 5 is a P$^+$ base region, 6 is an N$^+$ emitter region, 7 is an N$^+$ surface collector region, 8 is a polysilicon region filling a trench, and 9a is a silicon oxide film (isolation trench) surrounding the sides of the island buried collector region 3 and collector withstand voltage region 4 immediately thereabove. The regions 5, 6, and 7 are so-called high-concentration regions according to the present invention.

Additionally, 10 is a surface silicon oxide film, E, B, and C are respectively an emitter contact electrode, base contact electrode, and collector contact electrode composed of aluminum, 40 is an N$^-$ region surrounding the lateral periphery of this bipolar transistor with the silicon oxide film 9a interposed therebetween, 11 is an N$^+$ region (the so-called N type crystalline defect suppression region according to the present invention) formed deeply in this N$^-$ region 40, 12 is an N$^+$ contact region formed on the surface portion of this N$^+$ region 11, and 30 is a buried N$^+$ region immediately below the N$^-$ region 40.

A production process of this transistor will be described hereinafter.

Figure 2:
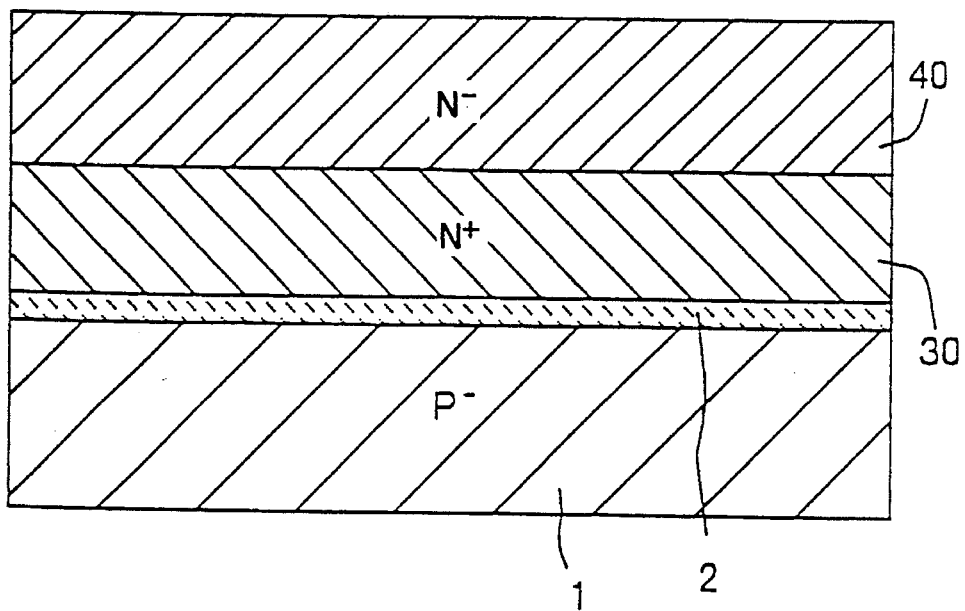
FIG. 2 is a sectional view indicating a production process of the first embodiment.

Firstly, as shown in FIG. 2, an N$^-$ type (110) monocrystalline silicon substrate 40 of relative resistance 3 to 5 Ohm-cm which is mirror polished is prepared, and antimony is diffused to 3 μm in the surface thereof with a vapor phase diffusion method to form an N$^+$ diffusion layer 30. Additionally, after one main face of the P$^-$ substrate 1 is separately mirror polished, thermal oxidation is performed to form the silicon oxide film 2 with a thickness of approximately 1.0 μm. These silicon substrate 1 and silicon substrate 40 are heated with an $H_2O_2$—$H_2SO_4$ liquid mixture, undergo hydrophilic treatment, are joined in a clean atmosphere at room-temperature, and are heated for two hours in a 1,100° C. $N_2$ atmosphere to bond. Next, mirror polishing is performed until for example the substrate 40 side reaches a thickness of 15 μm to form an SOI substrate.

Figure 3:
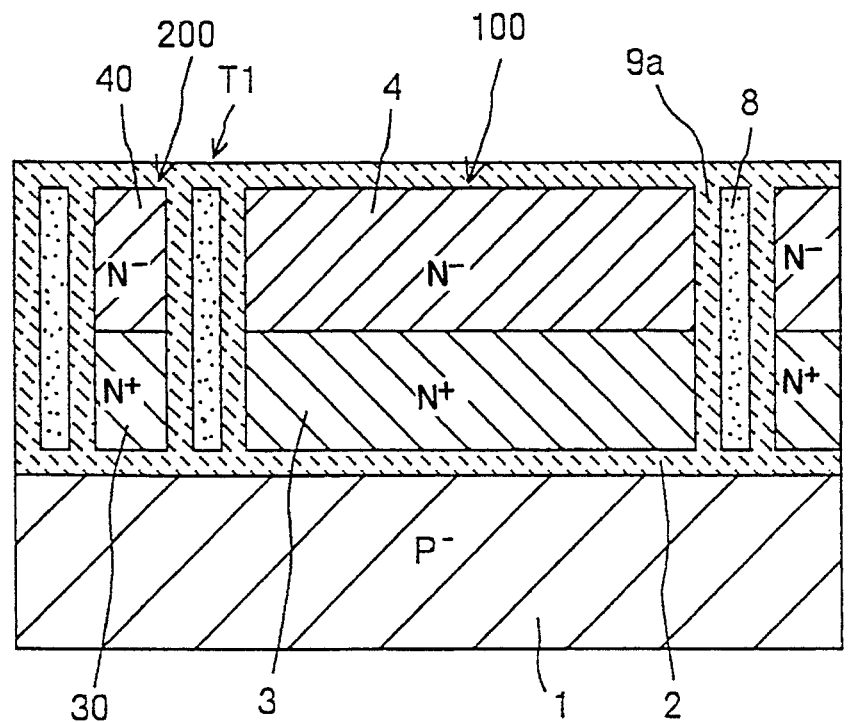
FIG. 3 is a sectional view indicating a production process of the first embodiment.
Figure 5:
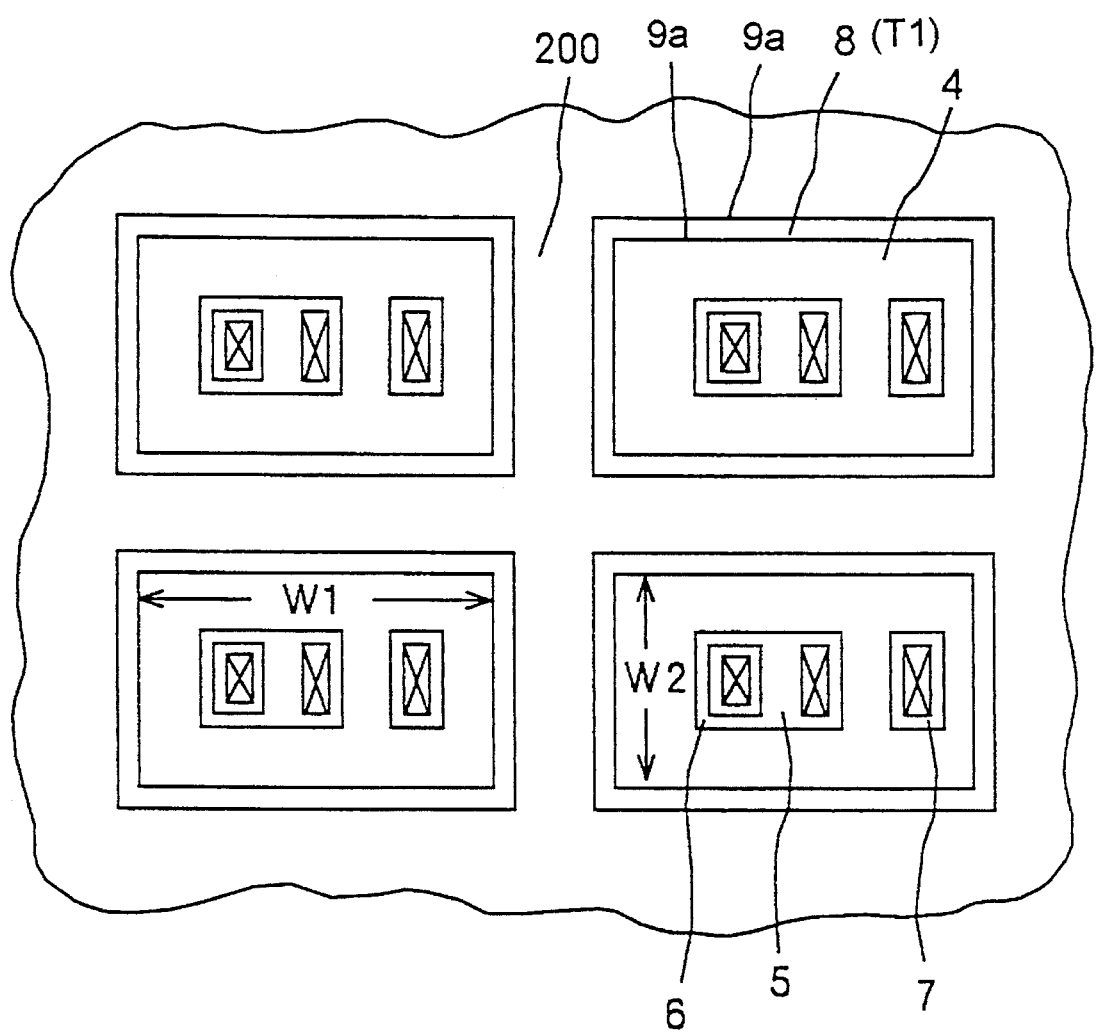
FIG. 5 is a partial plan view of a semiconductor device according to the first embodiment.

Next, a field oxide film of approximately 0.5 μm is formed on the surface of this SOI substrate with thermal oxidation, and a 0.1 μm silicon nitride film is formed thereon with an LPCVD method. Next, a resist mask is formed on the silicon nitride film, plasma etching and reactive ion etching by means of fluorine etching gas are performed, and a trench T1 is formed around the region where the bipolar transistor is to be formed and extending to the silicon oxide film 2. This trench T1 has a plane layout as shown in FIG. 5, and later becomes the polysilicon region 8. The surface of this trench T1 is oxidized to form the silicon oxide film 9a. Subsequently, polysilicon deposition is performed with the LPCVD method, the trench T1 is buried. Then, excess polysilicon deposited on the silicon nitride film surface is removed, the polysilicon surface exposed on the trench T1 surface is oxidized, and subsequently the silicon nitride film is removed by dry etching. By means of this, a polysilicon region 8 surrounded by the silicon oxide film 9a is formed in the interior of the trench T1, as shown in FIG. 3. That is to say, an island N$^+$ buried collector region 3 and N$^-$ collector withstand voltage region 4 as the so-called island semiconductor region 100 according to the present invention are isolated from the N$^+$ diffusion layer 30 and N$^-$ region 40 by means of this silicon oxide film 9a. Accordingly, the remaining N$^+$ region 30 and N$^-$ region 40, which surround this island semiconductor region 100 with the silicon oxide film 9a disposed therebetween, constitute a so-called adjacent semiconductor region 200 according to the present invention.

Figure 4:
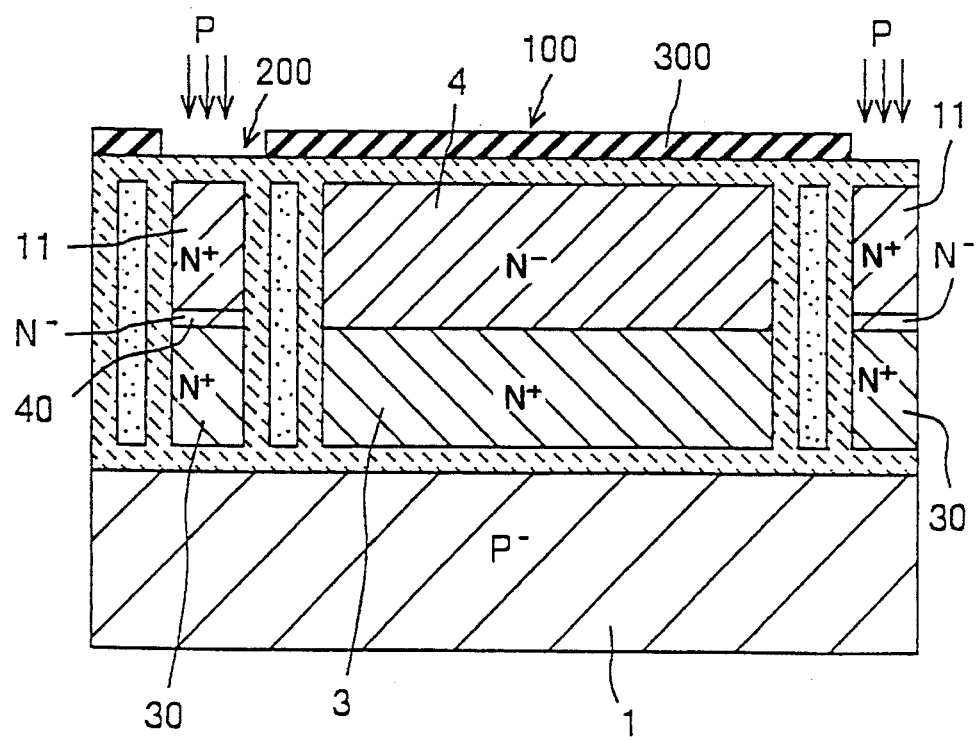
FIG. 4 is a sectional view indicating a production process of the first embodiment.

Next, as shown in FIG. 4, the region other than the adjacent semiconductor region 200, i.e., the island semiconductor region 100, is covered with a mask 300 and ion implantation of phosphorus ions is performed at approximately $10^{16}$ dose/cm$^2$ with 100 keV, the implanted ions are driven in under conditions of 1,170° C. for five hours, and by means of this the N type crystalline defect suppression region 11 of a doping concentration of $10^{19}$ atoms/cm$^3$ or more is formed in the n$^-$ region 40 of the adjacent semiconductor region 200.

Next, as shown in FIG. 1, the P$^+$ base region 5, N$^+$ emitter region 6, N$^+$ surface collector region 7, and N$^+$ contact region 12 are formed by a known series of processes, i.e., photolithographic process, ion implantation process, and drive-in process, and subsequently contact holes for electronic contact use are formed in the oxide film 10, and the respective electrodes E, B, C, and 13 are provided.

An example of parameters of the respective portions will be given below.

The doping concentration of the N$^-$ collector withstand voltage region 4 was set at $1 \times 10^{15}$ atoms/cm$^3$, the doping concentration at the surface of the P$^+$ base region 5 was set at $3 \times 10^{18}$ atoms/cm$^3$, the doping concentration of the N$^+$ emitter region 6 was set at $1 \times 10^{20}$ atoms/cm$^3$, the thickness of the collector withstand voltage region 4 between the base region 5 and buried collector region 3 was set at 4 μm, the doping concentration of the polysilicon region 8 filled within the trench was set at $1 \times 10^{20}$ atoms/cm$^3$, the width thereof was set at 1 μm, the thickness of the silicon oxide film 9a was set at 0.7 μm, and the junction depth of the base region 5 was set at 3 μm.

Furthermore, the width of the adjacent semiconductor region 200 was set at approximately 10 μm, the depth of the N type crystalline defect suppression region 11 was set at approximately 10 μm, and the plane dimensions W1×W2 of the island semiconductor region 100 were set at 50 μm×100 μm. A partial plan view is indicated in FIG. 5.

Figure 6:
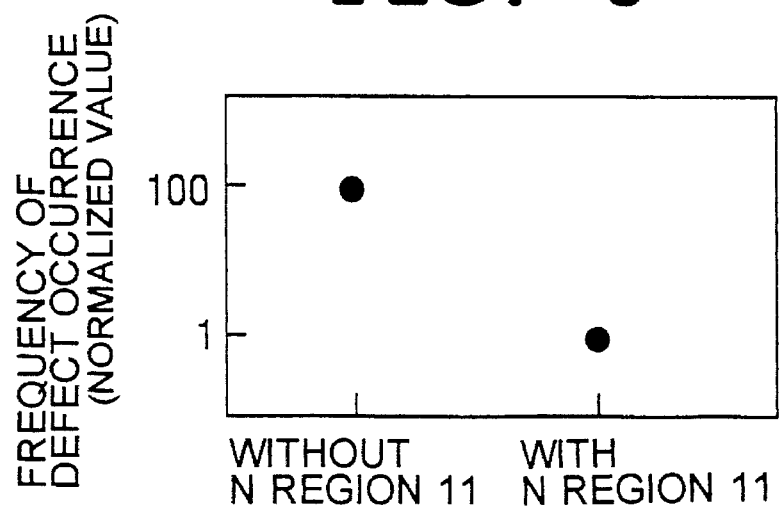
FIG. 6 is a diagram describing effects of a semiconductor device according to the first embodiment.
Figure 7:
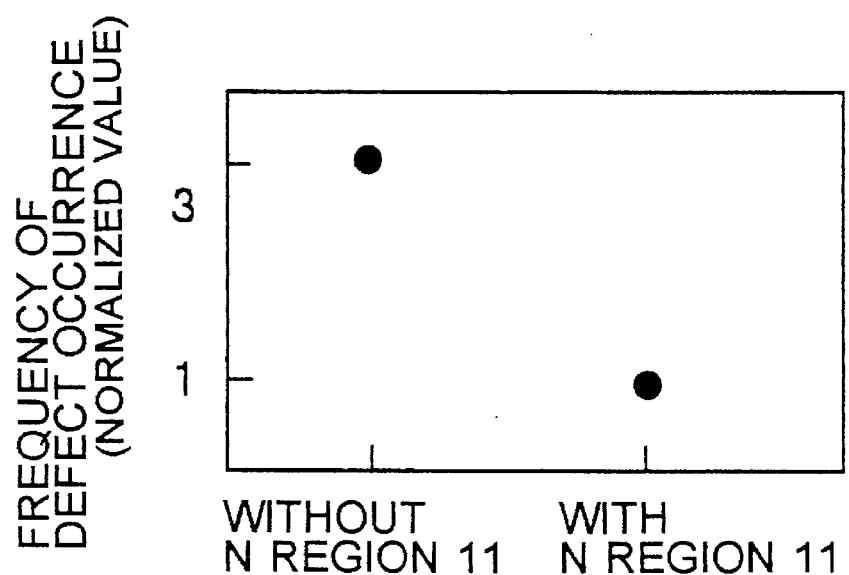
FIG. 7 is a diagram describing effects of a semiconductor device according to the first embodiment.

Next, FIG. 6 and FIG. 7 indicate the numbers of occurrence of crystalline defects per unit of square area (here 9 mm$^2$) in cases where the N type crystalline defect suppression region 11 was or was not formed. FIG. 7 is the average number of crystalline defects within the island semiconductor region 100, and FIG. 6 is the average number of crystalline defects within the adjacent semiconductor region 200 (20 samples).

It was understood through this experimentation that crystalline defects can be markedly reduced by means of formation of the N type crystalline defect suppression region 11.

Additionally, according to the foregoing embodiment, the N type crystalline defect suppression region 11 was doped after trench T1 formation. This is for the purpose of preventing lateral spread of the N type crystalline defect suppression region 11 due to drive-in. However, it is also possible to dope the N type crystalline defect suppression region 11 before trench T1 formation.

(Second Embodiment)

Figure 8:
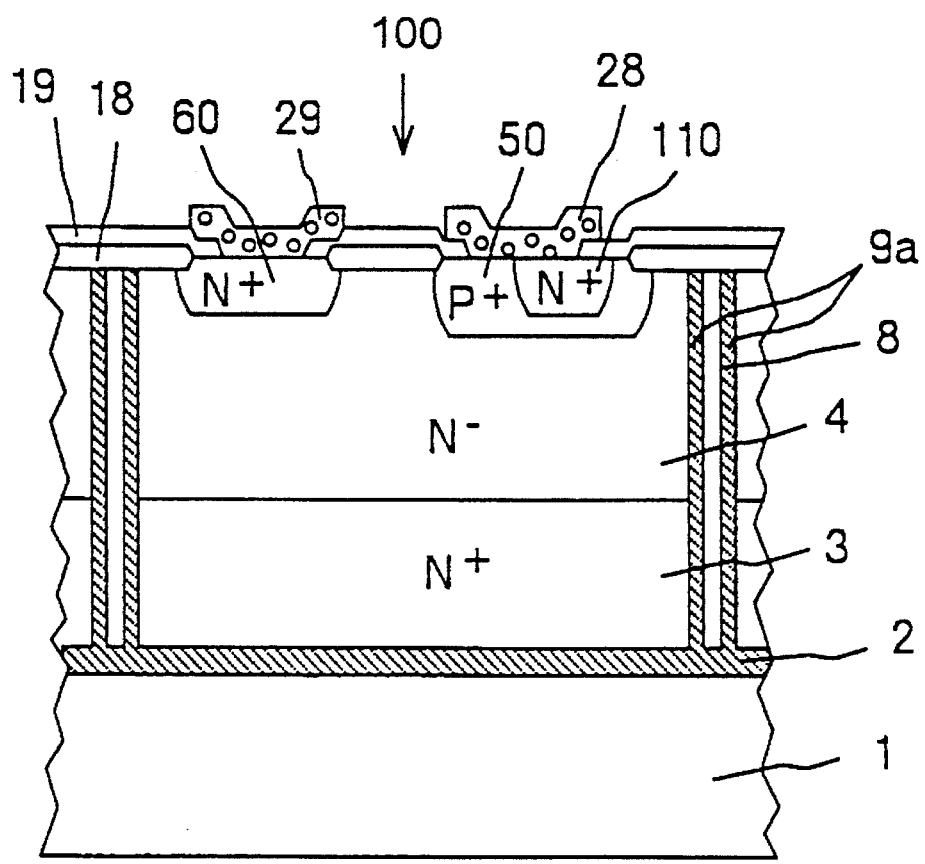
FIG. 8 is a sectional view of a semiconductor device according to a second embodiment of the present invention.

FIG. 8 shows a high withstand voltage junction diode as an embodiment of a dielectric isolated type semiconductor device according to a second aspect of the present invention.

This embodiment is an example of a junction diode formed in an island semiconductor region 100, with 50 being a P$^+$ region constituting an anode thereof, 60 being an N$^+$ region constituting a cathode thereof, 28 being an anode electrode, and 29 being a cathode electrode, composed respectively of doped polysilicon (or aluminum).

In particular, according to the present embodiment, an N type crystalline defect suppression region 110 with a doping concentration of 10$^{20}$ to 10$^{21}$ atoms/cm$^3$ is formed on the surface portion of the P$^+$ region 50 in a state allowing a contact region of the anode electrode 28 and P$^+$ region 50 to remain.

In addition to this, 1 is a P$^-$ silicon substrate (semiconductor substrate), 2 is a buried silicon oxide film for bottom insulation use, 3 is an N$^+$ buried region, 4 is an N$^-$ withstand voltage region, 8 is a polysilicon region filled in a trench (a so-called adjacent semiconductor region according to the present invention), and 9a is a silicon oxide film (isolation trench) surrounding the sides of the island buried N$^+$ region 3 and N$^-$ withstand voltage region 4 immediately thereabove.

Additionally, 18 is a LOCOS oxide film and 19 is a silicon oxide film formed thereabove.

The production process of this diode is fundamentally the same as the transistor of FIG. 1; the N type crystalline defect suppression region 110 and N$^+$ region 60 are formed with the same process as the emitter region 6 and collector region 7 of FIG. 1, and the P$^+$ region 50 is formed with the same process as the base region 5 of FIG. 1, but as shown in FIG. 8, the P$^+$ region 50 and N$^+$ region 60 are formed by means of ion implantation utilizing the opening of the LOCOS oxide film 18. In concrete terms, after the formation of the openings on the LOCOS oxide film 18, a resist mask is applied to the LOCOS oxide film 18 to form the P$^+$ region 50, the foregoing resist mask is subsequently removed, a new resist mask is applied to form the N$^+$ region 60 and N type crystalline defect suppression region 110, and subsequently the foregoing resist mask is removed. Then, after a silicon oxide film 19 is deposited, patterning is performed on the silicon oxide film 19 to form contact openings and next the electrodes 28 and 29 are provided.

The electrode 28 contacts both the P$^+$ region 50 and the N type crystalline defect suppression region 110. Further, the P$^+$ region 50 has a doping concentration of 1×10$^{18}$ atoms/cm$^3$ or more, which is less than the N type crystalline defect suppression region 110.

Additionally, according to this embodiment, the foregoing N type crystalline defect suppression region 11 of the first embodiment is not formed in an adjacent region.

An example of parameters of the respective portions will be given below. Parameters which are not stated are the same as for the first embodiment.

Figure 9:
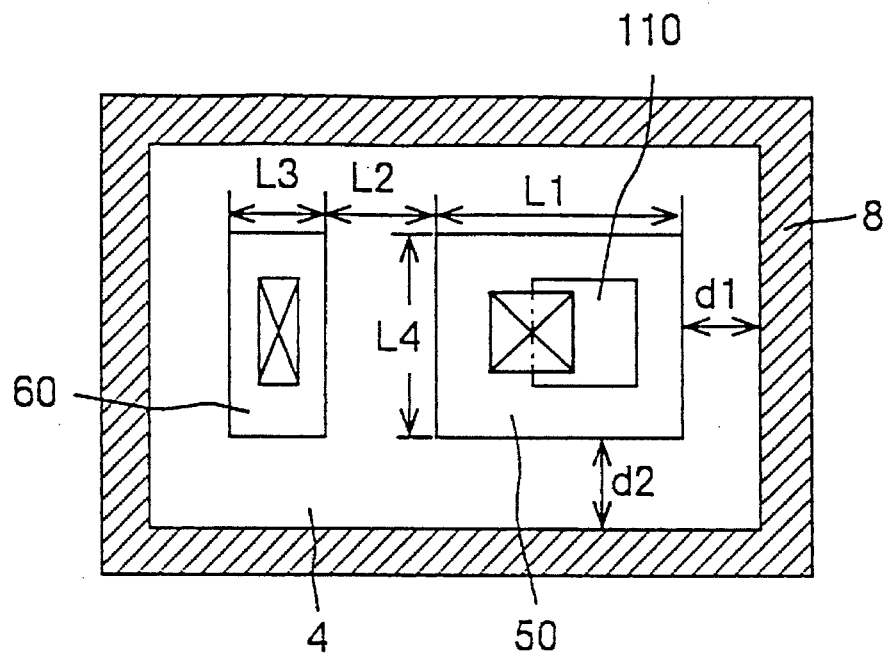
FIG. 9 is a partial plan view of a semiconductor device according to the second embodiment.

In FIG. 9, the plane dimensions L1×L4 of the P$^+$ region 50 were set equal to approximately 50 μm×20 μm, the junction depth thereof was set at approximately 3 μm, the width L3 of the N$^+$ region 60 was set at approximately 10 μm, the interval L2 between the P$^+$ region 50 and N$^+$ region 60 was set at approximately 10 μm, the distance d1 from the P$^+$ region 50 to the isolation region was set at approximately 5 μm, d2 was set at approximately 5 μm, and the junction depth of the N type crystalline defect suppression region 110 was set at approximately 2 μm.

Figure 10:
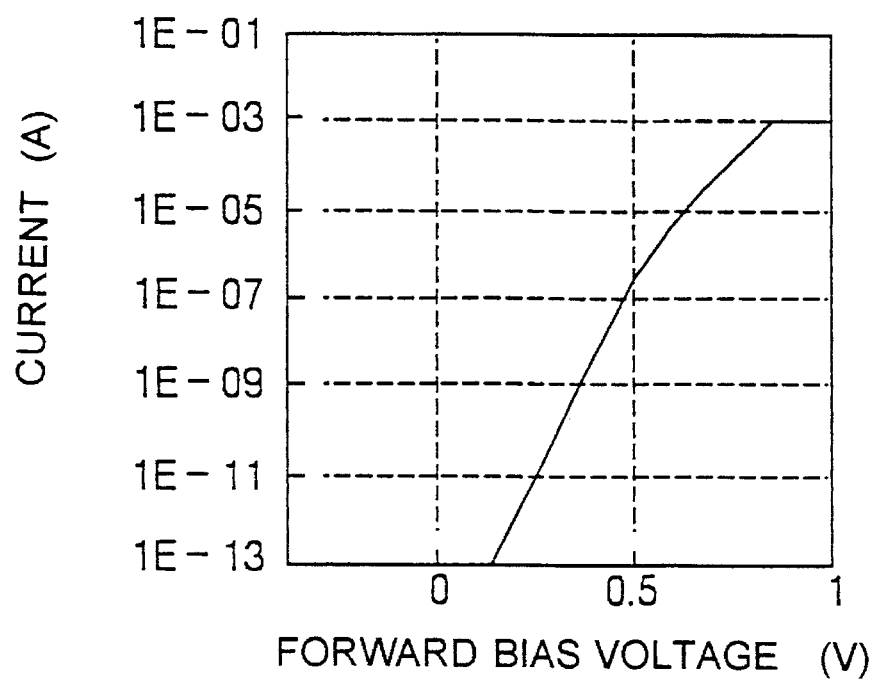
FIG. 10 is a graph showing a forward bias characteristic of a semiconductor device according to the second embodiment.
Figure 11:
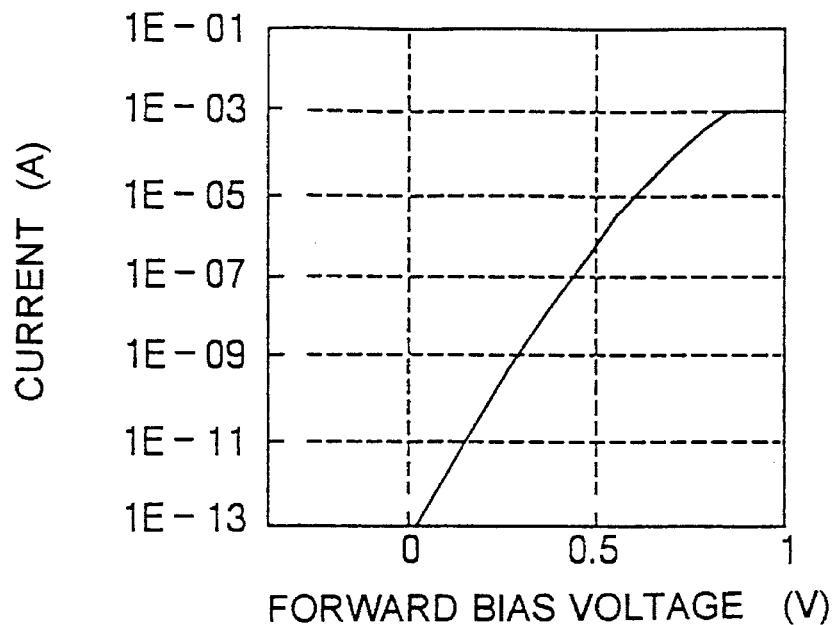
FIG. 11 is a graph showing a forward bias characteristic of a conventional semiconductor device.

FIG. 10 indicates the forward bias characteristics of the above-described diode, and FIG. 11 indicates the average forward bias characteristics (20 samples) in a case of identical production process and identical masking as the foregoing diode but no doping of the N type crystalline defect suppression region 110.

It is understood from FIG. 10 and FIG. 11 that a junction diode according to the present embodiment has excellent characteristics.

(Third Embodiment)

Figure 12:
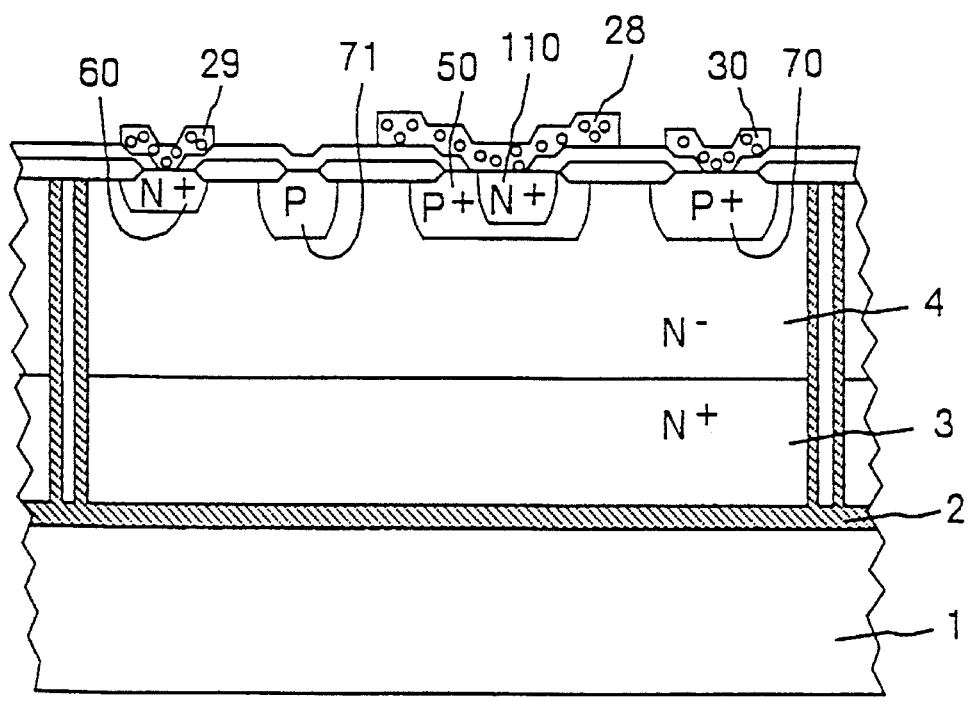
FIG. 12 is a sectional view of a semiconductor device according to a third embodiment of the present invention.

FIG. 12 shows a high withstand voltage PNP transistor as an embodiment of a dielectric isolated type semiconductor device according to a second aspect of the present invention.

This embodiment is an example of a lateral PNP bipolar transistor formed in an island semiconductor region 100, with 50 being a P$^+$ region constituting an emitter region thereof, 60 being an N$^+$ region constituting a surface base region thereof, 70 being a P$^+$ region constituting a collector thereof, 71 being a P$^+$ region for leak current cutting-off use, 110 being an N type crystalline defect suppression region, 28 being an emitter electrode, and 29 being a base electrode, and 30 being a collector electrode, composed respectively of doped polysilicon (or aluminum).

As can be immediately understood by comparing FIG. 12 and FIG. 8, the lateral PNP bipolar transistor of FIG. 12 is formed by the identical process as the junction diode production process of FIG. 8.

That is to say, the N type crystalline defect suppression region which constitutes a characteristic of this embodiment can also be incorporated within the P$^+$ emitter or P$^+$ collector of a PNP bipolar transistor.

Additionally, the N type crystalline defect suppression region 11 provided in the adjacent semiconductor region of the first embodiment may also be provided in an adjacent semiconductor region of the second or third embodiment.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A dielectric isolated type semiconductor device comprising:
   a semiconductor substrate;
   an island semiconductor region disposed on said semiconductor substrate, a bottom of which region is isolated from said semiconductor substrate;
   a diffusion region for forming a semiconductor device, formed on a surface portion of said island semiconductor region;
   an adjacent semiconductor region disposed proximate to said island semiconductor region; and
   an N type region doped at a surface portion of said adjacent semiconductor region, having a doping concentration higher than said surface portion of said adjacent semiconductor region, and having a junction depth deeper than said diffusion region, whereby crystalline defects in said island semiconductor region are suppressed.

2. A dielectric isolated type semiconductor device according to claim 1, further comprising an isolation trench disposed between said island semiconductor region and said adjacent semiconductor region, whereby said island semiconductor region is isolated from said adjacent semiconductor region.

3. A dielectric isolated type semiconductor device according to claim 2, wherein said N type region is formed at an entire surface of said surface portion of said adjacent semiconductor region.

4. A dielectric isolated type semiconductor device according to claim 3, wherein said N type region is a region doped with phosphorus at said doping concentration of $1\times10^{19}$ atoms/cm$^3$ or more.

5. A dielectric isolated type semiconductor device comprising:
   a semiconductor substrate;
   an island semiconductor region disposed on said semiconductor substrate, a bottom of which region is isolated from a semiconductor substrate;
   a P type region for forming a semiconductor device, formed on a surface portion of said island semiconductor region;
   an N type region formed within said P type region and having a doping concentration higher than a doping concentration of said surface portion of said island semiconductor region; and
   an electrode of said semiconductor device contacting said P type region, said electrode contacting said N type region as well,
   wherein said N type region suppresses crystalline defects in said island semiconductor region.

6. A dielectric isolated type semiconductor device according to claim 5, wherein said island semiconductor region and said P type region collectively form a diode as said semiconductor device and said P type region is an anode of said diode.

7. A dielectric isolated type semiconductor device according to claim 5, further comprising an adjacent semiconductor region disposed proximate to said island semiconductor region and an isolation trench disposed between said island semiconductor region and said adjacent semiconductor region, wherein said island semiconductor region is isolated from said adjacent semiconductor region by means of said isolation trench.

8. A dielectric isolated type semiconductor device according to claim 5, wherein said doping concentration of said N type region is higher than a doping concentration of said P type region.

9. A dielectric isolated type semiconductor device according to claim 8, wherein said N type region is a region doped with phosphorus at said doping concentration of $1\times10^{19}$ atoms/cm$^3$ or more.

10. A dielectric isolated type semiconductor device according to claim 5, wherein said island semiconductor region and said P type region collectively form a PNP bipolar transistor as said semiconductor device and said P type region is a region for one of an emitter and a collector of said PNP bipolar transistor.

11. A dielectric isolated semiconductor device comprising:
    a semiconductor substrate;
    an insulation film disposed on said semiconductor substrate;
    an N-type semiconductor island region for an element formation region disposed on said semiconductor substrate with said insulation film interposed therebetween,
    said semiconductor island region including a P-type diffusion region positioned at a surface thereof to form a semiconductor element within said semiconductor island region;
    an isolation wall including an insulating material and surrounding said semiconductor island region;
    an N-type adjacent semiconductor region disposed on said semiconductor substrate neighboring said semiconductor island region, said isolation wall being disposed between said semiconductor island region and said adjacent semiconductor region,
    said adjacent semiconductor region including an N-type diffusion region reaching from a surface of said adjacent semiconductor or a depth deeper than a depth of said P-type diffusion region in said semiconductor island regions, said N-type diffusion region making a doping concentration of a surface portion of said adjacent semiconductor region high, whereby crystalline defects in said semiconductor island region are suppressed.

12. A dielectric isolated type semiconductor device according to claim 11, wherein said adjacent semiconductor region surrounds said semiconductor island region with said isolation wall interposed therebetween.

13. A dielectric isolated type semiconductor device according to claim 12, wherein said N-type diffusion region is formed at an entire surface of said surface portion of said adjacent semiconductor region.

14. A dielectric isolated type semiconductor device according to claim 12, wherein said N-type diffusion region is a phosphorus diffused region whose concentration is $1\times10^{19}$ atoms/cm$^3$ or higher.

15. A dielectric isolated type semiconductor device according to claim 12, wherein said isolation wall includes a trench filled with said insulating material.

16. A dielectric isolated type semiconductor device according to claim 15, wherein said N-type diffusion region is a region an impurity of which is implanted into said adjacent semiconductor region after a formation of said trench.

* * * * *